(12) United States Patent
Kong et al.

(10) Patent No.: US 6,530,990 B2
(45) Date of Patent: Mar. 11, 2003

(54) SUSCEPTOR DESIGNS FOR SILICON CARBIDE THIN FILMS

(75) Inventors: Hua-Shuang Kong, Raleigh, NC (US); Calvin Carter, Jr., Cary, NC (US); Joseph Sumakeris, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 09/790,169

(22) Filed: Feb. 21, 2001

(65) Prior Publication Data

US 2001/0009141 A1 Jul. 26, 2001

Related U.S. Application Data

(62) Division of application No. 08/823,365, filed on Mar. 24, 1997, now Pat. No. 6,217,662.

(51) Int. Cl.$^7$ .............................................. C30B 25/12
(52) U.S. Cl. ........................ 117/84; 117/90; 117/101; 117/104; 117/952
(58) Field of Search ............................. 117/101, 952, 117/104, 84, 90

(56) References Cited

U.S. PATENT DOCUMENTS

| | | | |
|---|---|---|---|
| 3,436,255 A | 4/1969 | Harris et al. | |
| 3,892,940 A | 7/1975 | Bloem et al. | |
| 4,081,313 A | 3/1978 | McNeilly et al. | |
| 4,099,041 A | 7/1978 | Berkman et al. | |
| 4,123,571 A | 10/1978 | Balog et al. | |
| 4,186,684 A | 2/1980 | Intrater et al. | |
| 4,419,332 A | 12/1983 | Von Der ropp | |
| 4,496,609 A | 1/1985 | McNeilly et al. | |
| 4,499,354 A | 2/1985 | Hill et al. | |
| 4,579,080 A | 4/1986 | Martin et al. | |
| 4,728,389 A * | 3/1988 | Logar | 117/101 |
| 4,745,088 A * | 5/1988 | Inoue et al. | 117/101 |
| 4,836,138 A | 6/1989 | Robinson et al. | |
| 4,848,272 A | 7/1989 | Ohmura et al. | |
| 4,858,557 A | 8/1989 | Pozzetti et al. | |
| 4,938,815 A * | 7/1990 | McNeilly | 117/101 |
| 4,975,561 A | 12/1990 | Robinson et al. | |
| 4,986,215 A | 1/1991 | Yamada et al. | |
| 5,037,502 A * | 8/1991 | Suzuki et al. | 117/101 |
| 5,038,711 A | 8/1991 | Dan et al. | |
| 5,044,943 A | 9/1991 | Bowman et al. | |
| 5,118,642 A * | 6/1992 | Yoshino et al. | 117/101 |
| 5,119,540 A | 6/1992 | Kong et al. | |
| 5,136,978 A | 8/1992 | Ahern et al. | |
| 5,242,501 A | 9/1993 | McDiarmid | |
| 5,279,671 A | 1/1994 | Hosokawa | |
| 5,653,808 A | 8/1997 | MacLeish et al. | |
| 5,743,956 A * | 4/1998 | Habuka et al. | 117/101 |
| 5,759,264 A * | 6/1998 | Watanabe et al. | 117/101 |
| 5,820,686 A | 10/1998 | Moore | |
| 5,879,462 A | 3/1999 | Kordina et al. | |
| 6,217,662 B1 | 4/2001 | Kong et al. | |

FOREIGN PATENT DOCUMENTS

| | | |
|---|---|---|
| EP | 0258052 A2 | 3/1988 |
| EP | 0330708 A1 | 9/1989 |
| JP | 62190834 A | 8/1987 |

* cited by examiner

*Primary Examiner*—Robert Kunemund
(74) *Attorney, Agent, or Firm*—Summa & Allan, P.A.

(57) ABSTRACT

A susceptor is disclosed for minimizing or eliminating thermal gradients that affect a substrate wafer during epitaxial growth. The susceptor comprises a first susceptor portion including a surface for receiving a semiconductor substrate wafer thereon, and a second susceptor portion facing the substrate-receiving surface and spaced from the substrate-receiving surface. The spacing is sufficiently large to permit the flow of gases therebetween for epitaxial growth on a substrate on the surface, while small enough for the second susceptor portion to heat the exposed face of a substrate to substantially the same temperature as the first susceptor portion heats the face of a substrate that is in direct contact with the substrate-receiving surface.

9 Claims, 6 Drawing Sheets

SUSCEPTOR DESIGNS FOR SILICON CARBIDE THIN FILMS

CROSS-REFERENCE TO RELATED APPLICATION

This application is a divisional of U.S. application Ser. No. 08/823,365, filed Mar. 24, 1997 now U.S. Pat. No. 6,217,662.

FIELD OF THE INVENTION

The present invention relates to semiconductor manufacturing processes, and in particular relates to an improved susceptor design for epitaxial growth on silicon carbide substrates.

BACKGROUND OF THE INVENTION

The present invention relates to the production of epitaxial layers of semiconductor materials on silicon carbide substrates. Silicon carbide offers a number of advantageous physical and electronic characteristics for semiconductor performance and devices. These include a wide bandgap, high thermal conductivity, high saturated electron drift velocity, high electron mobility, superior mechanical strength, and radiation hardness.

As is the case with other semiconductor materials such as silicon, one of the basic steps in the manufacture of a number of silicon-carbide based devices includes the growth of thin single crystal layers of semiconductor material on silicon carbide substrates. The technique is referred to as "epitaxy," a term that describes crystal growth by chemical reaction used to form, on the surface of another crystal, thin layers of semiconductor materials with defined lattice structures. In many cases, the lattice structure of the epitaxial layers (or "epilayers") are either identical, similar, or otherwise related to the lattice structure of the substrate. Thus, epitaxial growth of either silicon carbide epitaxial layers on silicon carbide substrates or of other semiconductor materials on silicon carbide substrates, is a fundamental technique for manufacturing devices based on silicon carbide.

Silicon carbide is, however, a difficult material to work with because it can crystallize in over 150 polytypes, some of which are separated from one another by very small thermodynamic differences. Furthermore, because of silicon carbide's high melting point (over 2700° C.), many processes for working silicon carbide, including epitaxial film deposition, often need to be carried out at much higher temperature than analogous reactions in other semiconductor materials.

Some basic reviews of semiconductor manufacturing technology can be found for example in Sze, *Physics of Semiconductor Devices*, 2d Ed. (1981), Section 2.2, pages 64–73; or in Dorf, *The Electrical Engineering Handbook*, CRC Press, (1993) at Chapter 21 "Semiconductor Manufacturing," pages 475–489; and particularly in Sherman, *Chemical Vapor Deposition for Microelectronics: Principles, Technologies and Applications*, (1987), ISBN O-8155-1136-1. The techniques and apparatus discussed herein can be categorized as chemical vapor deposition (CVD) or vapor phase epitaxy (VPE) in which reactant gases are exposed to an energy source (e.g. heat, plasma, light) to stimulate a chemical reaction, the product of which grows on the substrate.

There are several basic techniques for CVD epitaxial growth, the two most common of which are the hot (heated) wall reactor and cold wall reactor processes. A hot wall system is somewhat analogous to a conventional oven in that the substrate, the epitaxial growth precursor materials, and the surrounding container are all raised to the reaction temperature. The technique offers certain advantages and disadvantages.

The second common conventional technique is the use of a "cold wall" reactor. In such systems, the substrate to be used for epitaxial growth is placed on a platform within a container (typically formed of quartz or stainless steel). In many systems, the substrate is disk-shaped and referred to as a "wafer." The substrate platform is made of a material that will absorb, and thermally respond to, electromagnetic radiations.

As is known to those familiar with such devices and techniques, the susceptor's response to electromagnetic radiation is an inductive process in which alternating frequency electromagnetic radiation applied to the susceptor generates an induced (inductive) current in the susceptor. The susceptor converts some of the energy from this inductive current into heat. In many systems, the electromagnetic radiation is selected in the radio frequency (RF) range because materials such as glass and quartz are transparent to such frequencies and are unaffected by them. Thus, the electromagnetic radiation passes through the container and is absorbed by the susceptor which responds by becoming heated, along with the wafer, to the temperatures required to carry out the epitaxial growth. Because the container walls are unaffected by the electromagnetic energy, they remain "cold" (at least in comparison to the susceptor and the substrate), thus encouraging the chemical reaction to take place on the substrate.

A thorough discussion of the growth of silicon carbide epitaxial layers on silicon carbide substrates is set forth for example in U.S. Pat. No. 4,912,063 to Davis et al. and U.S. Pat. No. 4,912,064 to Kong et al., the contents of both of which are incorporated entirely herein by reference.

The use of a cold wall reactor to carry out epitaxial growth, although satisfactory in many respects, raises other problems. In particular, because a semiconductor wafer rests on a susceptor, the wafer side in contact with the susceptor will become warmer than the remainder of the substrate. This causes a thermal gradient in the axial direction through the wafer. In turn, the difference in thermal expansion within the wafer caused by the axial gradient tends to cause the peripheral edges (typically the circumference because most wafers are disc-shaped) to curl away from, and lose contact with, the susceptor. As the edges lose contact with the susceptor, their temperature becomes lower than the more central portions of the wafer, thus producing a radial temperature gradient in the substrate wafer in addition to the axial one.

These temperature gradients, and the resulting physical effects, have corresponding negative affects on the characteristics of the substrate and the epitaxial layers upon it. For example, if the edges are placed in extreme tension, they have been observed to crack and fail catastrophically. Even if catastrophic failure is avoided, the epitaxial layers tend to contain defects. At silicon carbide CVD growth temperatures (e.g. 1300°–1800° C.), and using larger wafers (i.e. two inches or larger), wafer bending becomes a significant problem. For example, FIG. 3 herein plots the values of wafer deflection (H) at various axial temperature gradients as a function of the wafer diameters.

Furthermore, because wafers have a finite thickness, the heat applied by the susceptor tends to generate another temperature gradient along the central axis of the wafer.

Such axial gradients can both create and exacerbate the problems listed above.

Yet another temperature gradient typically exists between the rear surface of the substrate wafer and the front surface of the susceptor; i.e. a surface-to-surface gradient. It will thus be understood that both radiant and conductive heat transfer typically take place between susceptors and substrate wafers. Because many susceptors are formed of graphite coated with silicon carbide, the thermodynamic driving force created by the large temperature gradients between the susceptor and the silicon carbide wafers also causes the silicon carbide coating to undesirably sublime from the susceptor to the wafer.

Additionally, because such sublimation tends to promote pin hole formation in the susceptor coating, it can permit contaminants from the graphite to escape and unintentionally dope the substrates or the epilayers. This in turn ultimately leads to non-uniform doping levels in the semiconductor material, and reduces the lifetime of the susceptor. The problems created by susceptors which undesirably emit dopants is set forth for example in the background portion of U.S. Pat. No. 5,119,540 to Kong et al.

Nevertheless, a need still exists for susceptors that can operate at the high temperatures required for silicon carbide processing while minimizing or eliminating these radial, axial and surface to surface temperature gradients, and the associated physical changes and problems.

OBJECT AND SUMMARY OF THE INVENTION

Therefore, it is an object of the present invention to provide a susceptor for minimizing or eliminating radial, axial and surface-to-surface thermal gradients across a substrate wafer.

The invention meets this object with a susceptor that comprises a first portion that includes a surface for receiving a semiconductor substrate wafer thereon, and a second portion facing the substrate receiving surface and spaced from the substrate receiving surface with the spacing being sufficiently large to permit the flow of gases therebetween for epitaxial growth on a substrate. The spacing remains small enough, however, for the second susceptor portion to heat the exposed face of a substrate to substantially the same temperature as the first susceptor portion heats the face of the substrate that is in direct contact with the substrate receiving surface.

In another aspect, the invention is a method for minimizing or eliminating thermal gradients in and around a substrate during epitaxial growth by heating a portion of a susceptor that faces, but avoids contact with, a semiconductor substrate, and that is spaced sufficiently far from the substrate to permit the flow of gases between the substrate and the susceptor portion to encourage epitaxial growth on the substrate facing the susceptor portion wherein the susceptor is thermally responsive to the irradiating radiation.

The foregoing and other objects, advantages and features of the invention, and the manner in which the same are accomplished, will be more readily apparent upon consideration of the following detailed description of the invention taken in conjunction with the accompanying drawings, which illustrate preferred and exemplary embodiments, and wherein:

DETAILED DESCRIPTION OF THE PREFERRED EMBODIMENTS

Figure 1:
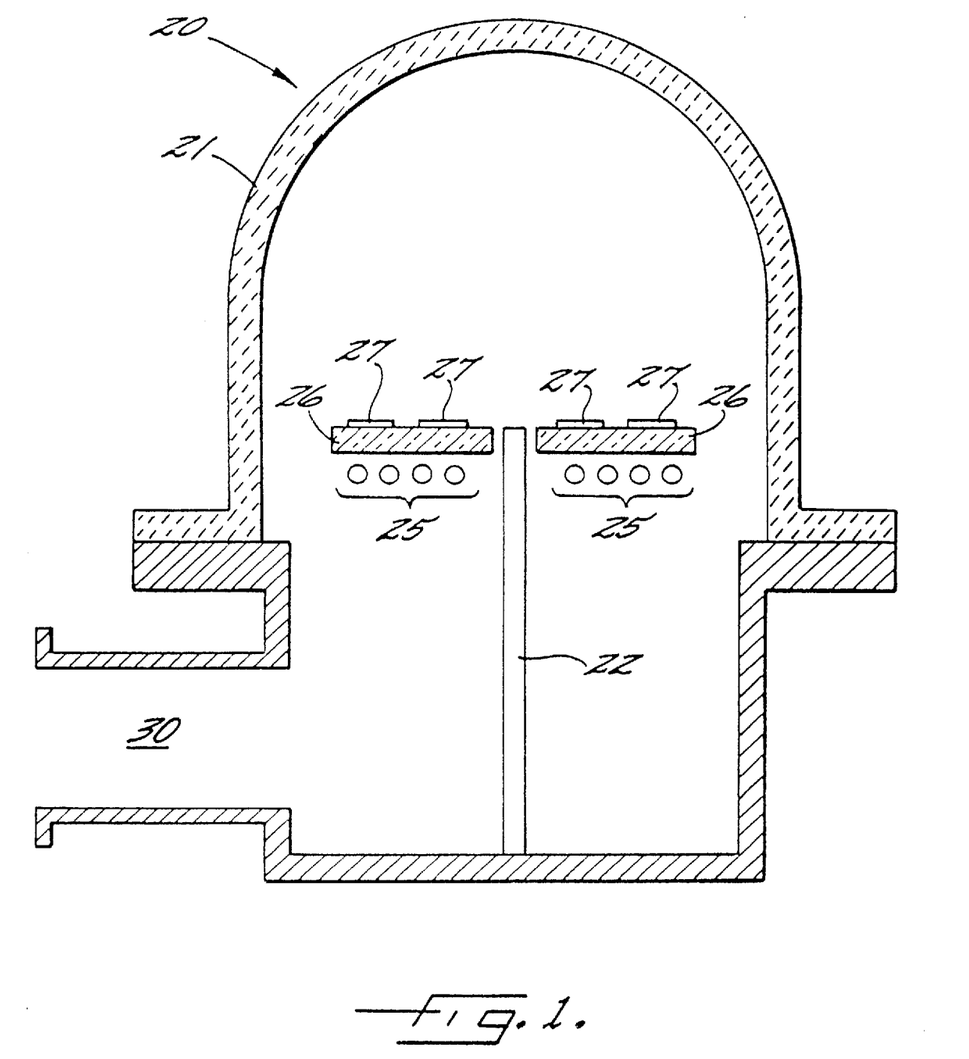
FIG. 1 is a cross-sectional view of a platform type chemical vapor deposition (CVD) system.
Figure 2:
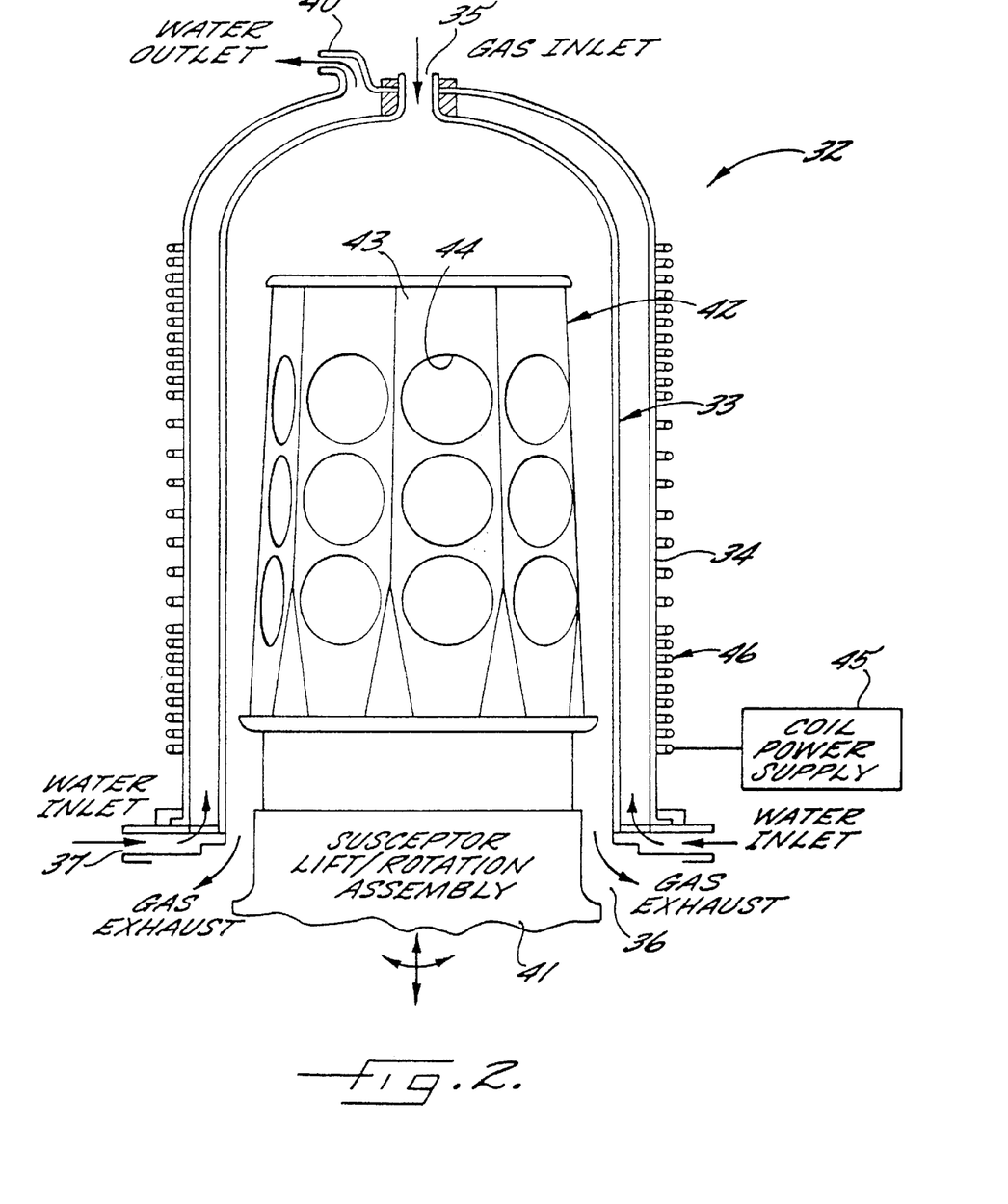
FIG. 2 is a cross-sectional view of a barrel-type CVD system.

The present invention is a susceptor for minimizing or eliminating thermal gradients, including radial, axial, and surface-to-surface gradients, that affect a substrate wafer during epitaxial growth. Substrates according to the present invention are particularly useful for chemical vapor deposition systems as illustrated in FIGS. 1 and 2. FIG. 1 shows a platform or pancake type CVD system broadly designated at 20. The system comprises a reactor vessel 21 formed of a material, typically a quartz tube or bell jar, that is substantially transparent to the appropriate frequencies of electromagnetic radiation. A gas supply system is in fluid communication with the reaction vessel 21 and in FIG. 1 is illustrated as the gas injector 22.

The system includes a source of electromagnetic radiation that in FIG. 1 is illustrated as the induction coils 25. The operation of such generators and induction coils is generally well known to those of ordinary skill in the art, and will not be discussed further herein in detail. As is also understood in this art, alternative heating techniques can include electric resistance heating, radiant lamp heating, and similar techniques.

The chemical vapor deposition system shown in FIG. 1 also includes the platform type susceptor 26 with semiconductor substrates, typically disc-shaped wafers 27 thereon. FIG. 1 also illustrates the pumping port 30 for evacuating the system as desired.

FIG. 2 illustrates a system that is very similar in terms of its basic operation, but that is a barrel-type susceptor, rather than a pancake-type. In FIG. 2, the CVD system is broadly designated at 32 and shows a reaction vessel 33 which is surrounded by a water jacket 34 which circulates water against the walls of the reaction vessel 33. The CVD system 32 also includes a gas inlet 35 and a gas exhaust 36, a water inlet 37 and the water outlet 40, and a lifting and rotation assembly 41 for the susceptor.

The susceptor itself is broadly designated at 42 and is in the general shape of a cylinder, although with a shallow slope that gives it somewhat frustoconical shape. The cylinder is formed of a plurality of adjacent straight sidewall sections 43 that define the cylinder. A plurality of wafer pockets 44 are positioned on the sidewalls 43 and hold the semiconductor substrates thereon. The slight incline of the susceptor walls help keep the wafers in the pockets 44, and improve the uniformity of the resulting epilayers by encouraging more favorable gas flow. FIG. 2 also illustrates the power supply 45 for the induction coil broadly designated at 46.

Figure 3:
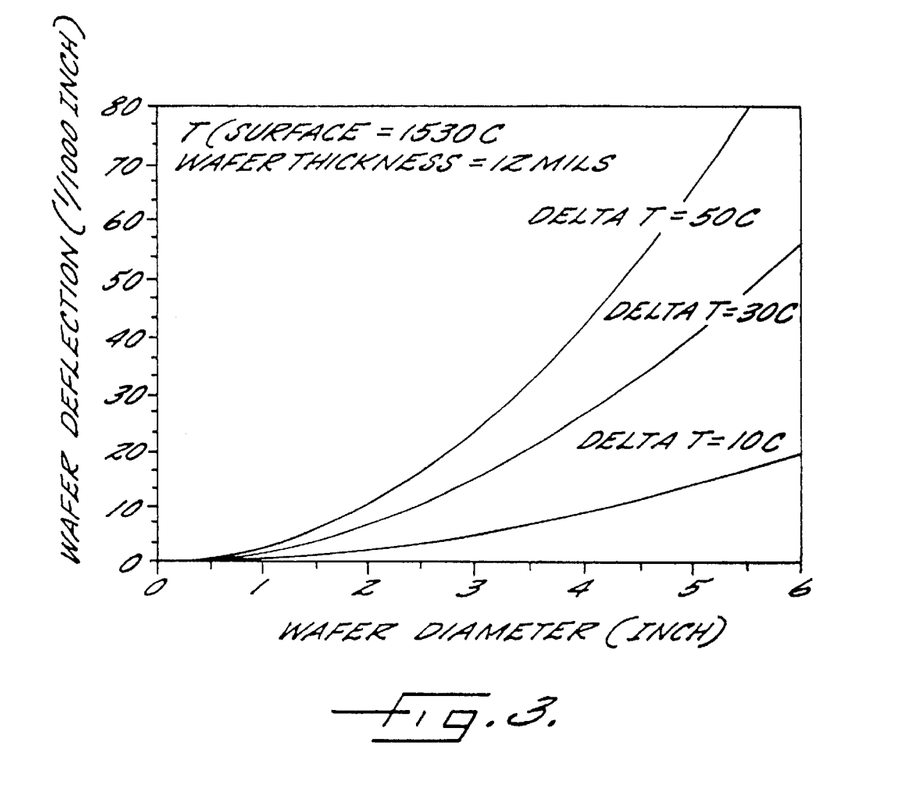
FIG. 3 is a graph illustrating the relationship between wafer deflection and wafer diameter at various temperature gradients.

FIG. 3 is a graph that helps illustrate the problem addressed by the present invention. In FIG. 3, the deflection of a wafer expressed in thousandths of an inch is plotted against the wafer diameter in inches for three different temperature gradients ("Delta T"). As noted in FIG. 3, the susceptor surface temperature is 1530° C. and the wafer thickness is 12 mils (0.012 inch). As FIG. 3 illustrates, wafer deflection represents a minimal problem when the diameter of the substrate wafer is about an inch or less. For larger wafers, particularly those of two, three or even four inches, the deflection becomes more severe, even at relatively low temperature gradients.

Figure 4:
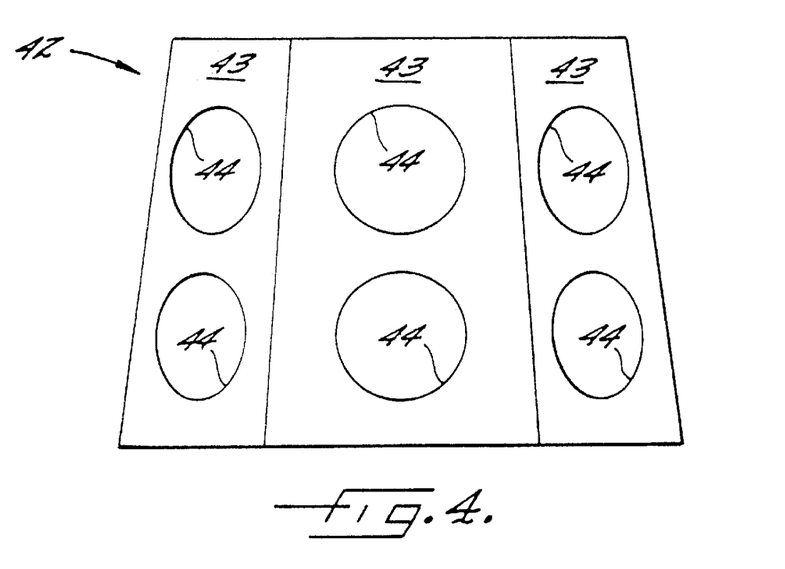
FIG. 4 is a schematic view of a barrel-type susceptor.

FIG. 4 illustrates a barrel type susceptor similar to that used in the illustration of FIG. 2. Using the same numbering system as FIG. 2, the susceptor is broadly designated at 42, is made of a plurality of straight sidewalls 43 that together define the generally cylindrical shape. The sidewalls 43 include a plurality of wafer pockets 44 for holding the substrate wafer.

Figure 5:
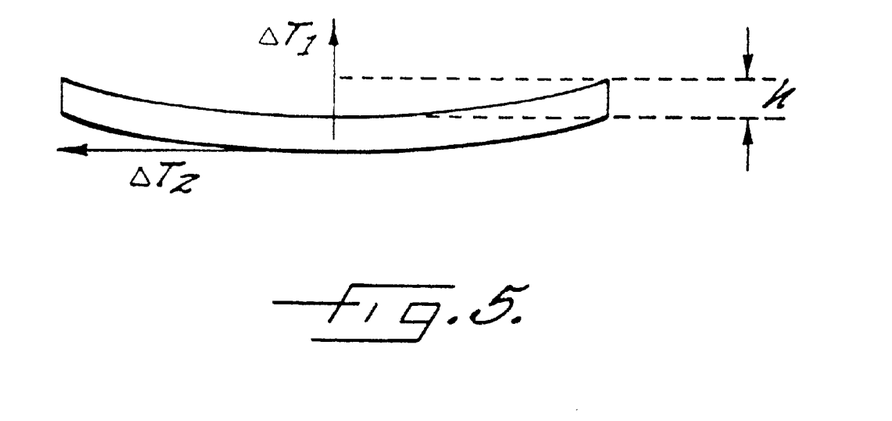
FIG. 5 is a schematic view of wafer deflection and temperature gradients.

FIG. 5 is a schematic illustration of the effects of the temperature gradients plotted in FIG. 3, and includes the designation of the axial temperature gradient ($\Delta T_1$) and of the radial gradient ($\Delta T_2$).

Figure 6:
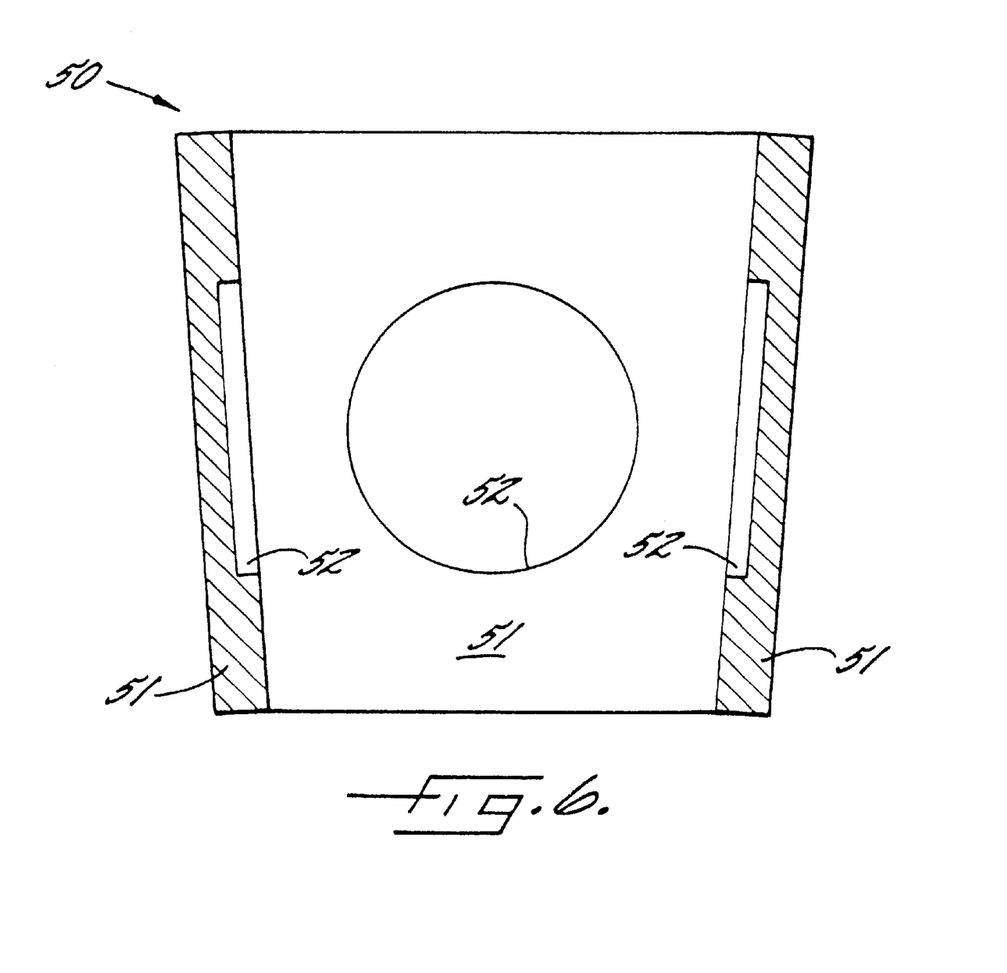
FIG. 6 is a cross-sectional view of one embodiment of a susceptor according to the present invention.

FIG. 6 illustrates a susceptor according to the present invention that is most appropriately used in the barrel type systems illustrated in FIG. 2. In the embodiment illustrated in FIG. 6, the susceptor is broadly designated at 50 and is a cylinder formed of a plurality of adjacent straight sidewall sections 51. FIG. 6 illustrates two of the sidewalls in cross-section and one in side elevation. The straight sidewall sections 51, of which there are most typically four, six, or eight, are formed of a material that is thermally responsive to selected frequencies of electromagnetic radiation. As noted above, the most common electromagnetic radiation is in the radio frequency range, so the susceptor material is generally selected to be thermally responsive to such RF frequencies. In preferred embodiments, the susceptor 50 is formed of graphite coated with silicon carbide.

In a presently preferred embodiment, the electromagnetic radiation is applied in the 8–10 kilocycle range using a solid state power supply that takes advantage of the inherent efficiencies of solid state technology. Those familiar with inductive CVD processes will also recognize that thicker susceptor walls require lower frequencies to achieve the most efficient penetration.

In the embodiment illustrated in FIG. 6, the susceptor 50 includes a plurality of wafer pockets 52 on the inner circumference of the cylinder. Thus, when the susceptor 50 is heated, the facing walls radiantly heat the front of the wafers while the susceptor heats the rear. As FIG. 6 illustrates, in this embodiment, the sidewalls 51 preferably define an inverted truncated cone with a relatively shallow slope as compared to a true cylinder. As noted earlier, the shallow slope in the sidewalls 51 makes it somewhat easier to retain the wafers in the pockets 52 during chemical vapor deposition, and also helps provide a proper flow pattern for the CVD gases.

Figure 7:
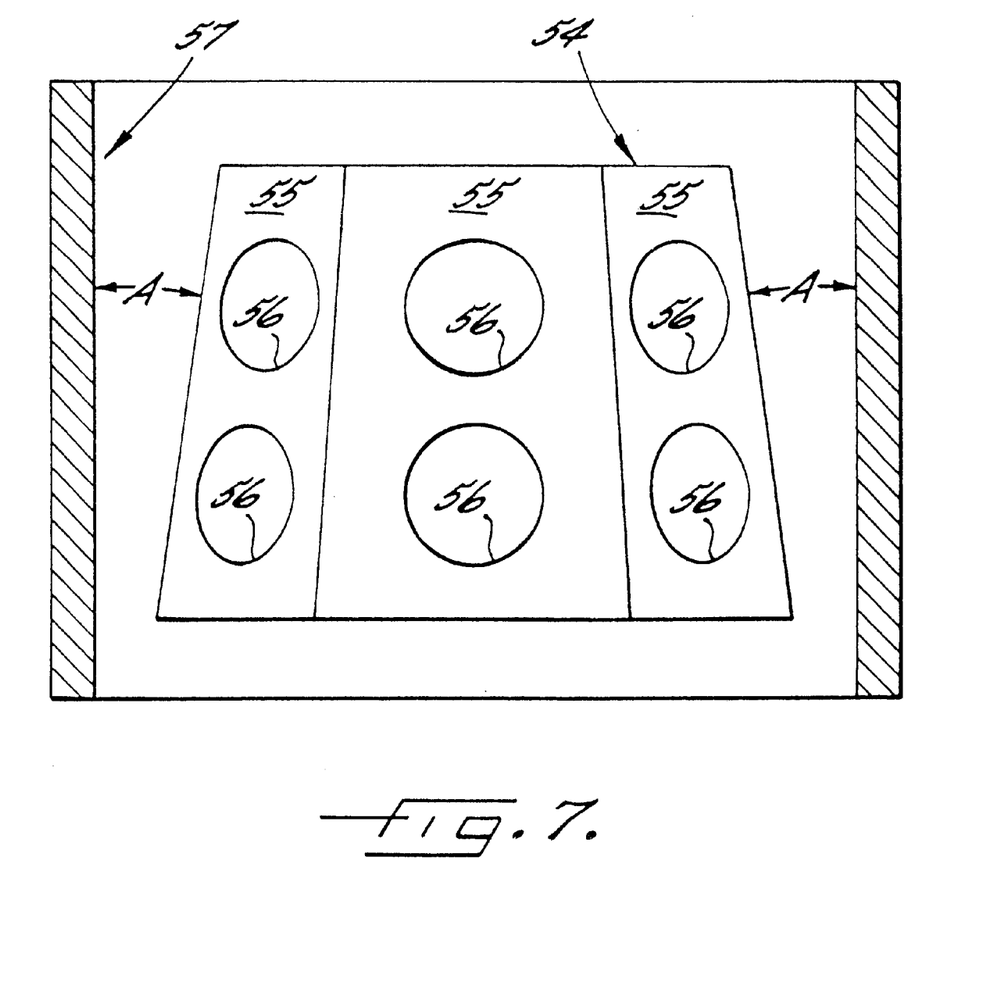
FIG. 7 is a partial cross-sectional view of a second embodiment of the susceptor of the present invention.

FIG. 7 illustrates a next embodiment of the invention in which the susceptor comprises a first cylinder (or "barrel") broadly designated at 54. The cylinder is defined by a plurality of adjacent straight sidewall sections 55, and is formed of a material that is thermally responsive to selected frequencies of electromagnetic radiation. The cylinder 54 includes a plurality of wafer pockets 56 on the outer surface of the sidewall sections 55.

A second cylinder broadly designated at 57 surrounds the first cylinder 54 and defines an annular space A between the first and second cylinders. The second cylinder 57 is likewise made of a material that is thermally responsive to the selected frequencies of electromagnetic radiation, and the annular space between the first and second cylinders (54, 57) is sufficiently large to permit the flow of gases therebetween for epitaxial growth on substrates in the wafer pockets 56, while small enough for the second cylinder 57 to heat the exposed face of substrates to substantially the same temperature as the first cylinder 54 heats the faces of substrates that are in direct contact with the first cylinder.

The first and second cylinders 54, 57 can be formed of either the same or different materials. If used in a barrel type susceptor system as illustrated in FIG. 2, the second cylinder 57 tends to heat the first cylinder 54 to encourage the cylinders to reach substantially the same temperatures. As in other embodiments, each of the cylinders is most preferably formed of graphite coated with silicon carbide.

It will be understood that the use of a silicon carbide coating on such susceptors is a function of the ceramic properties of polycrystalline silicon carbide and is otherwise not related to its semiconductor properties. Thus, susceptors made of stainless steel, graphite, graphite coated with silicon carbide, or silicon carbide, are typically used in the semiconductor industry for CVD processes.

Figure 8:
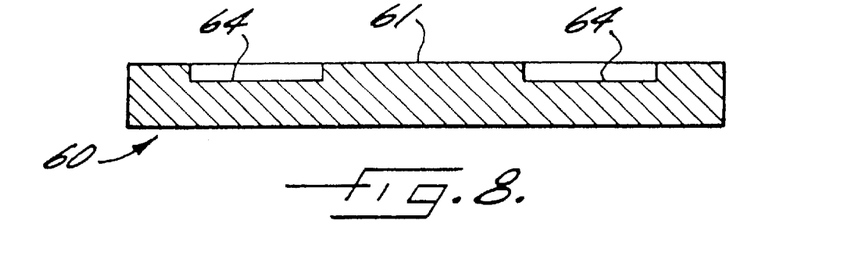
FIG. 8 is a cross-sectional view of a pancake-type susceptor.
Figure 9:
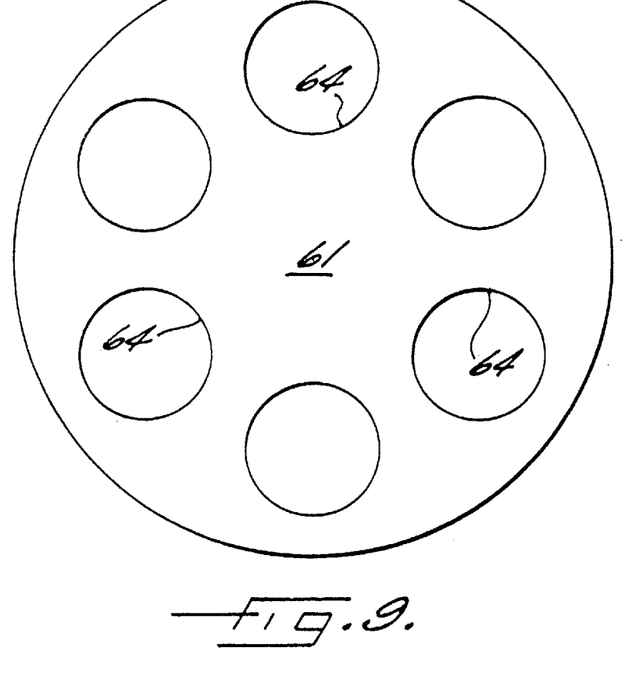
FIG. 9 is a top plan view of a pancake-type susceptor.
Figure 10:
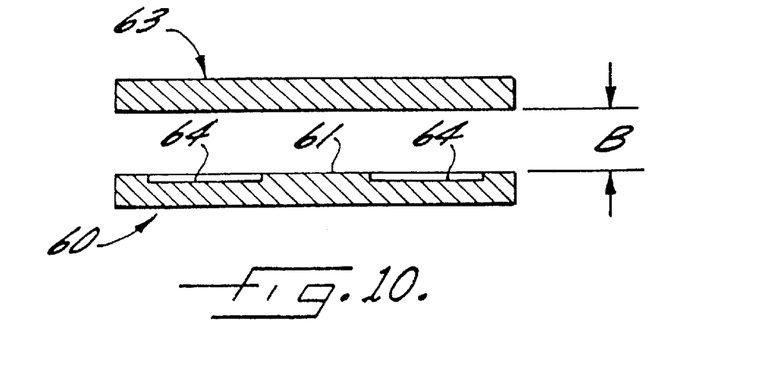
FIG. 10 is a cross-sectional view of a pancake-type susceptor according to the present invention.

FIGS. 8, 9 and 10 illustrate another susceptor according to the present invention. FIGS. 8 and 9 illustrate, in cross-section and top plan view respectively, a pancake or plate-shaped susceptor broadly designated at 60. The susceptor 60 has a top surface 61 for receiving semiconductor substrate wafers thereon. In this embodiment, the invention further comprises a horizontally disposed second susceptor portion 63 parallel to and above the wafer receiving surface 61 of the first susceptor portion 60. Both of the susceptor portions 60 and 63 are formed of materials that are thermally responsive to selected frequencies of electromagnetic radiation, and as in the previous embodiments, are preferably formed of the same material to be responsive to the same frequencies of electromagnetic radiation. Most preferably, both susceptor portions 60 and 63 are formed of graphite coated with silicon carbide. As in the previous embodiments, the spacing designated B (FIG. 10) between the two portions 60, 63 is sufficiently large to permit the flow of gases therebetween for epitaxial growth on a substrate on the surface 61, while small enough for the second susceptor portion 63 to heat the exposed face of a substrate to substantially the same temperature as the first susceptor portion 60 heats the face of substrate that is in direct contact with the substrate receiving surface 61. As illustrated in FIGS. 8, 9 and 10, the top surface 61 of the first horizontal susceptor portion 60 preferably includes a plurality of wafer pockets 64.

In each of these embodiments, it will be understood that the two susceptor portions can be connected to one another, or separate portions of a single susceptor, or independent pieces as may be desired or necessary under various circumstances. Additionally, the optimum spacing between the substrate portions can be determined by computer modeling or actual practice, and without requiring undue experimentation.

In another aspect, the invention comprises a method for minimizing or eliminating thermal gradients in a substrate during epitaxial growth. In this aspect, the invention comprises irradiating a susceptor, or a susceptor portion, that faces, but avoids contact with, a semiconductor substrate wafer, and that is spaced sufficiently far from the wafer to permit the flow of gases between the substrate and the facing susceptor to thereby encourage epitaxial growth on the substrate facing the susceptor portion. As in the structural embodiments, the susceptor is thermally responsive to the irradiating radiation.

As further set forth with respect to the structural aspects of the invention, the invention also preferably comprises concurrently irradiating a separate susceptor portion upon which the wafer rests so that the exposed face of the substrate is heated to substantially the same temperature as is the face of the substrate that is in direct contact with the other susceptor portion.

The method further comprises the steps of directing source gases that flow between the heated susceptor portions. If the epitaxial layers are to be formed of silicon carbide, the method preferably comprises directing silicon and carbon containing source gases such as silane, ethylene, and propane.

Where other materials, such as Group III nitrides, are to form the epitaxial layers on the silicon carbide, the step of directing source gases can include directing gases such as trimethyl aluminum, trimethyl gallium, trimethyl indium, and ammonia.

In preferred embodiments, the method also comprises the step of preparing the substrate surface for growth. As set forth in more detail in the references incorporated above, such preparation can comprise steps such as oxidizing the surface followed by a chemical etching step to remove the oxidized portion leaving a prepared surface behind, or alternatively, dry etching the silicon carbide surface to prepare it for further growth. As in most epitaxial growth technique, surface preparation further typically comprises lapping and polishing the substrate surface prior to the oxidation or etching steps.

In the drawings and specifications, there have been disclosed typically preferred embodiments of the invention and, although specific terms have been employed, they have been used in a generic sense and in descriptive sense only, and not for purposes of limitation, the scope of the invention being set forth in the following claims:

What is claimed is:

1. A method for minimizing or eliminating thermal gradients that affect a substrate during epitaxial growth, the method comprising:

heating a portion of a susceptor that faces, but avoids contact with, a semiconductor substrate and that is spaced sufficiently far from the substrate to permit the flow of gases between the substrate and the susceptor portion to encourage epitaxial growth on the substrate facing the susceptor portion, while concurrently heating the wafer through direct contact with a second susceptor portion by heating the second susceptor portion upon which the wafer rests so that the exposed face of the substrate is heated to substantially the same temperature as is the face of the substrate that is in direct contact with the second susceptor portion.

2. A method according to claim 1 wherein the heating step comprises irradiating a susceptor that is thermally responsive to certain frequencies of the electromagnetic radiation with electromagnetic radiation within the range of those certain frequencies.

3. A method according to claim 1 and further comprising the step of directing source gases to flow between the heated susceptor portions.

4. A method according to claim 1 wherein the source gases are selected from the group consisting of silane, ethylene, propane and mixtures thereof.

5. A method according to claim 1 wherein the source gases comprise trimethyl gallium and ammonia.

6. A method according to claim 4 and further comprising the step of preparing the substrate surface for growth.

7. A method according to claim 6 wherein the substrate comprises silicon carbide, and the surface preparation comprises an oxidation step followed by a chemical etching step to remove the oxidized portion.

8. A method according to claim 6 wherein the substrate comprises silicon carbide, and the surface preparation comprises dry etching the silicon carbide surface.

9. A method according to claim 6 wherein the surface preparation comprises lapping and polishing the substrate surface.

* * * * *